United States Patent [19]

Kishi et al.

[11] Patent Number: 5,221,416
[45] Date of Patent: Jun. 22, 1993

[54] PLASMA SURFACE TREATING METHOD

[75] Inventors: Toshinori Kishi, Osaka; Michiyoshi Nagashima, Ikoma; Fumiaki Ueno, Hirakata; Taro Nambu, Kobe; Hiroyuki Ogawa, Moriguchi, all of Japan

[73] Assignee: Matsushita Electric Industrial Co., Ltd., Kadoma, Japan

[21] Appl. No.: 708,870

[22] Filed: May 31, 1991

[30] Foreign Application Priority Data

May 31, 1990 [JP] Japan .................. 2-143127

[51] Int. Cl.$^5$ .................. B44C 1/22; B05D 3/06; B05D 11/00
[52] U.S. Cl. .................. 156/627; 118/712; 118/723; 118/730; 118/50.1; 118/620; 156/643; 156/655; 156/345; 427/535

[58] Field of Search .............. 156/643, 655, 668, 627, 156/345; 427/38, 39; 118/712, 730, 723, 50.1, 620; 204/298.7, 298.33, 298.34, 298.03, 298.06, 298.32; 134/1

[56] References Cited

U.S. PATENT DOCUMENTS 5,110,405 5/1992 Sawabe et al. .................. 427/39 X Primary Examiner—William A. Powell
Attorney, Agent, or Firm—Wenderoth, Lind & Ponack

[57] ABSTRACT

In a plasma surface treating method, a sample to be treated is supported on a first electrode within a vacuum vessel and a second electrode is caused to confront the first electrode. Active species of negative ions are then generated by means of a direct current glow discharge produced in an abnormal glow discharge region and are subsequently impinged upon a surface of the sample to induce a chemical reaction with the sample.

3 Claims, 5 Drawing Sheets

PLASMA SURFACE TREATING METHOD

BACKGROUND OF THE INVENTION

1. Field of the Invention

The present invention relates to a plasma surface treating method and an apparatus therefor both utilizable for the formation of an oxide on a surface of a metal or a semiconductor at a high processing speed and also for the removal of a photoresist remaining on the surface during the course of a fine patterning process at a high processing speed, and wherein the extent to which the plasma surface treatment has progressed can be detected easily.

2. Description of the Prior Art

Some of the prior art plasma surface treating apparatuses will be discussed with reference to FIGS. 1 and 2.

Referring first to FIG. 1, reference numeral 1 represents a vacuum vessel; reference numeral 2 represents a first electrode which serves as an anode; reference numeral 3 represents a sample to be treated; reference numeral 4 represents a second electrode which serves as a cathode; reference numeral 5 represents a source of direct electric current; and reference numeral 6 represents a high frequency oscillator.

In the prior art plasma surface treating apparatus of a construction shown in FIG. 1, a high frequency generated from the high frequency oscillator 6 is applied to a gaseous medium introduced into the vacuum vessel 1 to generate a plasma inside the vacuum vessel 1.

Active species contained in the plasma generated in the vicinity of the high frequency oscillator 6 reach a surface of the sample 3 by an action of an electric field, developed between the first electrode 2 serving as the anode and the second electrode serving as the cathode, thereby to accomplish a surface treatment of the sample 3.

When the active species obtained are positive ions, the sample 3 to be treated is placed on the second electrode 4. In contrast, when the active species obtained are negative ions, the sample 3 to be treated is placed on the first electrode 2.

The voltage applied across the first electrode or anode 2 and the second electrode or cathode 4 should not be too high in order for the high frequency oscillator 6 to produce the plasma in stabilized fashion. In view of this, the prior art plasma surface treating apparatus generally employs some tens volts to be applied across the first electrode 2 and the second electrode 4 and is so designed as to form the electric field sufficient to guide the active species in the plasma towards the sample by the application of this voltage.

However, the prior art plasma surface treating apparatus discussed above is unable to provide a relatively high plasma current density and, accordingly, requires a long time to complete the surface treatment. Also, the prior art plasma surface treating apparatus requires the use of the high frequency oscillator 6 for the generation of the plasma, rendering the apparatus as a whole to be complicated in structure and expensive to manufacture.

The other prior art plasma surface treating apparatus shown in FIG. 2 comprises a vacuum vessel 1, a sample 3 to be treated, a source of direct electric current 5, and a cathode 7. In this prior art plasma surface treating apparatus, the vacuum vessel 1 confronting the cathode 7 serves as an anode and, therefore, when a voltage is applied to the anode (i.e., the vacuum vessel 1) and the cathode 7, a glow discharge is effected in a normal glow-discharge region between the anode 1 and the cathode 7, thereby to transform a gaseous medium in this normal glow-discharge region into a plasma.

However, in this prior art plasma surface treating apparatus, regardless of whether the active species in the plasma are positive ions or whether the active species in the plasma are negative ions, a gradient of increase in electric potential between the anode (i.e., the vacuum vessel 1) and the cathode 7 is steep in the vicinity of the cathode 7 and moderate in the vicinity of the anode as shown in a graph of FIG. 3.

Accordingly, the plasma surface treating apparatus as shown in FIG. 2 is applicable only where the principle active species are positive ions. In other words, where the principle active species are positive ions, the active species are drawn towards the sample by the steep gradient of increase in electric potential observable in the vicinity of the cathode and subsequently impinge upon the surface of the sample 3 to accomplish the surface treatment. However, where the principle active species are negative ions, most of the active species will only drift in the vicinity of the anode. Accordingly, the frequency of impingement of the active species upon the sample 3 is very low, thereby failing to accomplish a satisfactory surface treatment of the sample and, if not impossible, accomplishing the surface treatment at an extremely low processing speed. This is because the gradient of increase in electric potential observable in the vicinity of the anode is substantially flat.

Summarizing the foregoing, the prior art plasma surface treating apparatus of the construction shown in FIG. 1 has problems in that the processing speed is low and in that the use of the high frequency oscillator is essential enough to render the apparatus as a whole to be complicated in structure and expensive to manufacture. On the other hand, the prior art plasma surface treating apparatus of the construction shown in FIG. 2 has a problem in that, although simple in structure as compared with the plasma surface treating apparatus of FIG. 1, the apparatus itself cannot be used where the principle active species are negative ions.

Also, in any one of the prior art plasma surface treating apparatuses, it has been found difficult to comprehend the progress of plasma surface treatment taking place.

SUMMARY OF THE INVENTION

The present invention has been devised with a view to substantially eliminating the above discussed disadvantages inherent in the prior art plasma surface treating apparatuses and is intended to provide a plasma surface treating method and an apparatus therefor which is simple in structure and can accomplish the plasma surface treatment at an increased processing speed and wherein the progress of reaction taking place and the termination thereof can be easily detected.

According to the present invention, a high voltage is applied across an electrode, supporting a sample to be treated, and a counterelectrode, disposed in face-to-face relationship with the electrode, to generate a direct current glow discharge in an abnormal glow-discharge region, thereby to transform a gaseous medium introduced into a vacuum vessel into a plasma so that active species generated can impinge upon a surface of the sample to initiate a chemical reaction with the sample.

Preferably, an entire electric circuit used to generate a glow-discharge may be applied with a negative bias.

Preferably, one of the electrode and the counterelectrode may be constituted by the sample itself and, in such a case, an ammeter or a similar current measuring instrument may be disposed between the sample and the ground or between the sample and a source of direct electric current capable of applying the negative bias to the sample.

According to the present invention, the direct current glow discharge is caused to occur in an abnormal glow discharge region between the electrode supporting the sample and the other electrode opposite to such electrode to form the plasma. Because of this, the density of plasma can be considerably increased. As a result thereof, even though the principle active species are negative ions, the active species as a whole may drift between the electrodes, however, the number of the active species reaching the surface of the sample is increased as compared with that in the prior art and, therefore, the processing speed at which the surface treatment is carried out can be increased considerably. Also, since the direct current glow discharge is utilized to produce the plasma, the use of the high frequency oscillator for generating the plasma can be advantageously dispensed with.

In addition, since the electroconductivity of the surface of the sample varies with a progress of the plasma surface treatment, the progress and the termination of a chemical reaction taking place can be detected by monitoring a change in electric current flowing in an electric circuit including the electrodes.

BRIEF DESCRIPTION OF THE DRAWINGS

This and other objects and features of the present invention will become more apparent from the following description taken in conjunction with the preferred embodiments thereof with reference to the accompanying drawings, throughout which like parts are designated by like reference numerals, and wherein.

DETAILED DESCRIPTION OF THE PREFERRED EMBODIMENTS

While the present invention will be described in detail in connection with some preferred embodiments thereof, the present invention will be described as applied in removing a photoresist remaining on a surface of an electroconductive substrate.

First Preferred Embodiment

Figure 4:
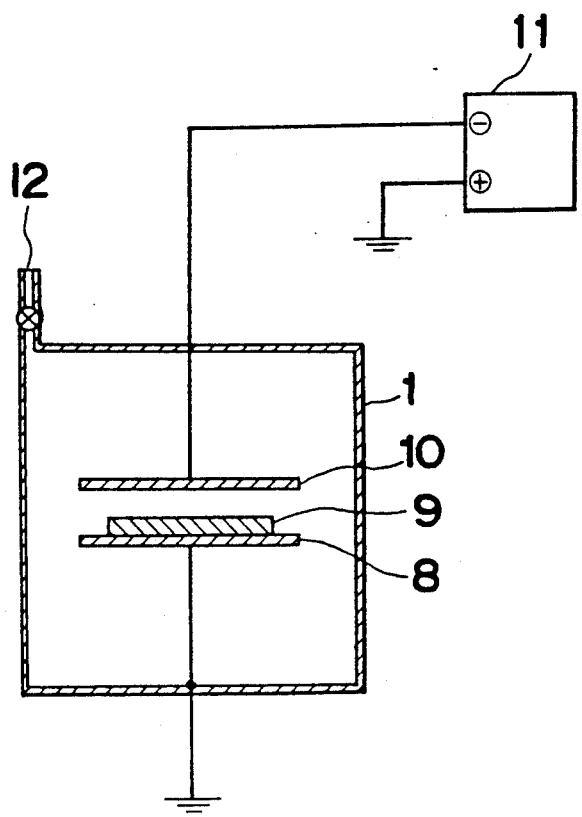
FIG. 4 is a schematic sectional view of a plasma surface treating apparatus according to a first preferred embodiment of the present invention.

Referring to FIG. 4, a plasma surface treating apparatus according to a first preferred embodiment of the present invention comprises a vacuum vessel 1 and an electrode 8 electrically connected to the ground and supporting an electroconductive substrate 9 mounted thereon in electrically connected relationship therewith. The apparatus also comprises a counterelectrode 10 held in face-to-face relationship with the electrode 8, and a source 11 of direct electric current for applying a voltage across the electrode 8 and the counterelectrode 10 to generate a plasma. The vacuum vessel 1 has a gas inlet port 12 defined therein.

The electroconductive substrate 9 referred to above is in the form of a copper master disc having pits formed thereon for the production of optical discs. The electroconductive substrate 9, that is, the copper master disc, is assumed to have a photoresist which had been used for the formation of the pits thereon and has not yet been removed therefrom. In describing the present invention, the photoresist remaining on the electroconductive substrate 9 is removed in the following manner by the utilization of oxygen plasma.

For this purpose, between the electrode 8 and the counterelectrode 10, a direct-current glow discharge is generated in an abnormal glow-discharge region to provide the plasma. Conditions for the formation of the plasma by means of the glow discharge in the abnormal discharge region depend on the pressure inside the vacuum vessel 1 and the distance between the electrode 8 and the counterelectrode 10, examples of which will now be described.

The distance between the electrode 8 and the counterelectrode 10 is chosen to be within the range of 2 to 3 cm and the distance between the counterelectrode 10 and a surface of the electroconductive substrate 9 mounted on the electrode 8 is chosen to be about 1 cm.

With respect to the pressure inside the vacuum vessel 1, after the vacuum vessel 1 has been evacuated to about $10^{-2}$ Pascal, oxygen was introduced into the vacuum vessel 1 through the gas inlet port 12 to render the pressure inside the vacuum vessel 1 to be about 10 Pascal. Under this condition, a voltage of about $-400$ volts relative to the grounded electrode 8 was applied to the counterelectrode 10 to induce a direct current glow discharge in an abnormal glow-discharge region thereby to produce an oxygen plasma. The reason for the electrode 8 used as an anode is that, in the case of an oxidizing process, the principle active species for the oxidization are negative ions ($O^{2-}$, $O^{-}$). The negative ions of oxygen so formed can react with the photoresist remaining on the surface of the copper substrate 9 to remove the photoresist from the surface of the copper substrate 9. It is to be noted that the smaller the distance between the electrode 8 and the counterelectrode 10 is, the higher is the current density of the plasma and, hence, the higher is the reaction speed.

Figure 5:
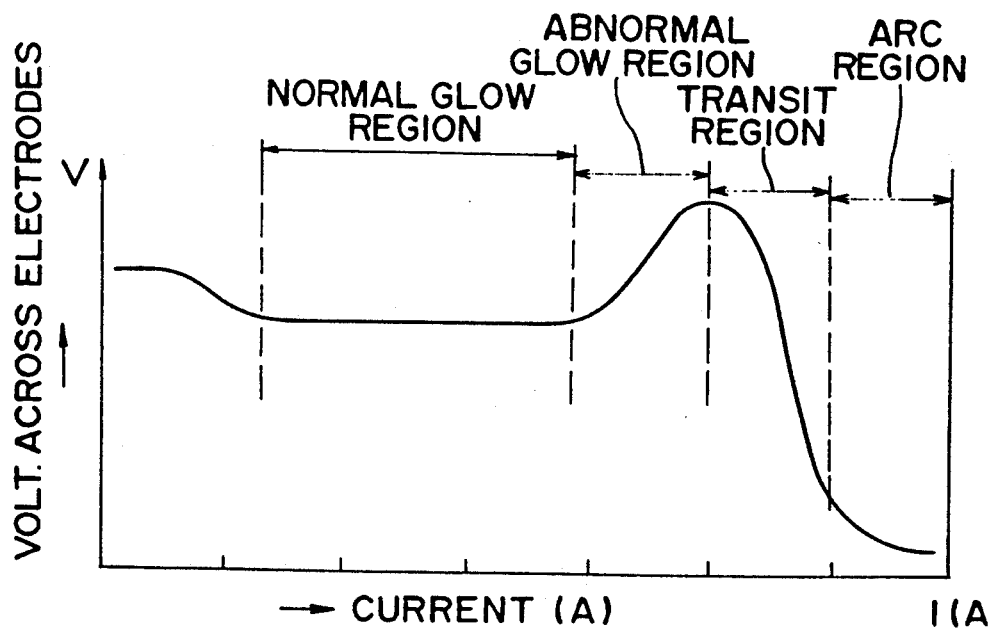
FIG. 5 is a graph showing voltage-current characteristics of a low-pressure sustained discharge.

In general, the relationship between the applied voltage and the electric current exhibited under a low pressure is such as shown in the graph of FIG. 5.

According to the first embodiment of the present invention, the plasma surface treatment is carried out in the abnormal glow discharge region and, accordingly, the electric current between the electrode 8 and the counterelectrode 10 is of a high value. As a result, the plasma density between the electrode 8 and the counterelectrode 10 increases considerably. Accordingly, even though the principle active species are negative ions, the active species as a whole may drift between the electrodes, but the number of the active species reaching the surface of the sample is increased as compared with that in the prior art and, therefore, the processing speed at which the surface treatment is carried out can be increased considerably.

Figure 1:
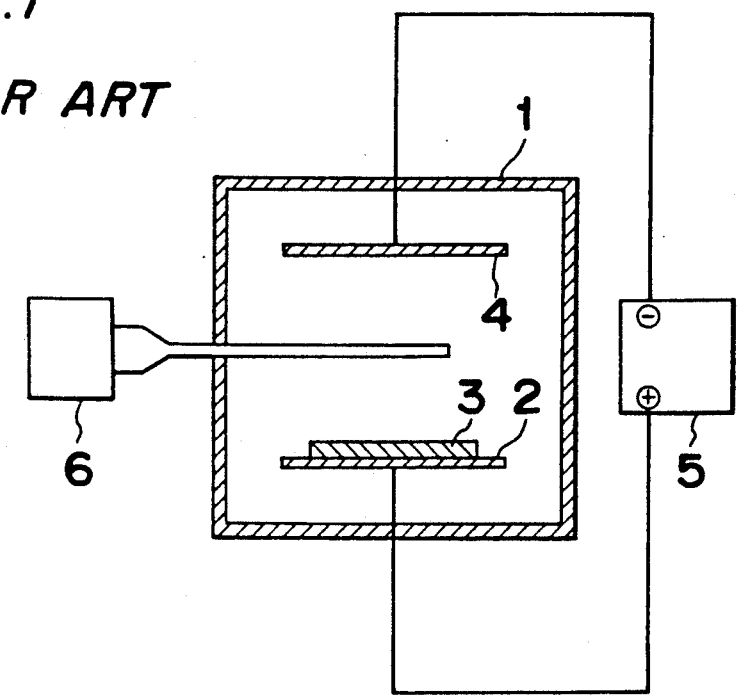
FIGS. 1 and 2 are schematic sectional views of the two prior art plasma surface treating apparatuses.
Figure 2:
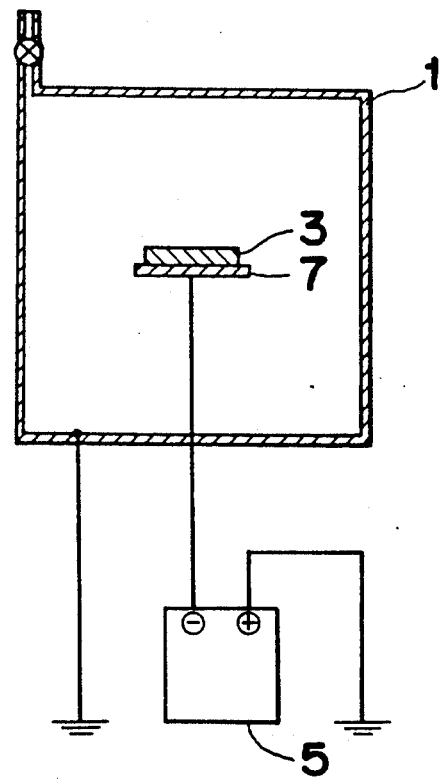
Figure 3:
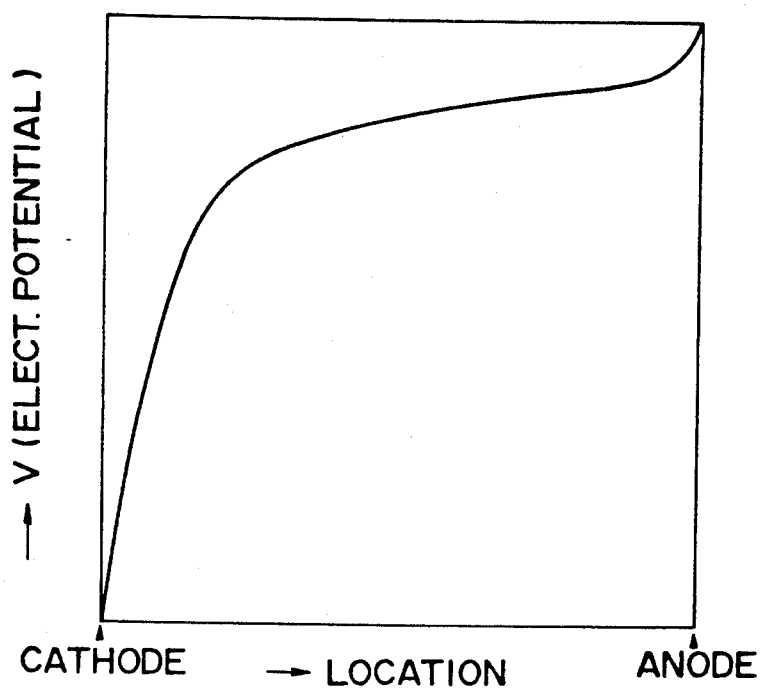
FIG. 3 is a graph showing a gradient of variation of an electric potential in the plasma in the prior art apparatus of FIG. 2.

According to the foregoing embodiment of the present invention, since the high voltage is applied across the electrode 8 and the counterelectrode 10 to generate the direct current glow discharge in the abnormal glow discharge region thereby to produce the plasma of a high current density, it is possible to accomplish a plasma processing at a high processing speed by the utilization of the negative ions. Also, the use of the high frequency oscillator hitherto necessitated in the prior art plasma surface treating apparatus shown in FIG. 1 can be advantageously dispensed with.

Also, where the surface treatment is carried out by the use of positive ions as the active species, and specifically where a surface of a silicon substrate is to be nitrided by the use of nitrogen ions, the plasma surface treatment can be accomplished at an increased processing speed if the bias voltage applied to the counterelectrode 10 is switched from a negative bias voltage over to a positive bias voltage.

Although in describing the foregoing embodiment reference has been made to the use of the copper substrate as the electroconductive substrate 9, the electroconductive substrate 9 may be made of any other metal than copper or any suitable alloy. Also, the present invention is equally applicable to the substrate made of semiconductor.

Second Preferred Embodiment

Figure 6:
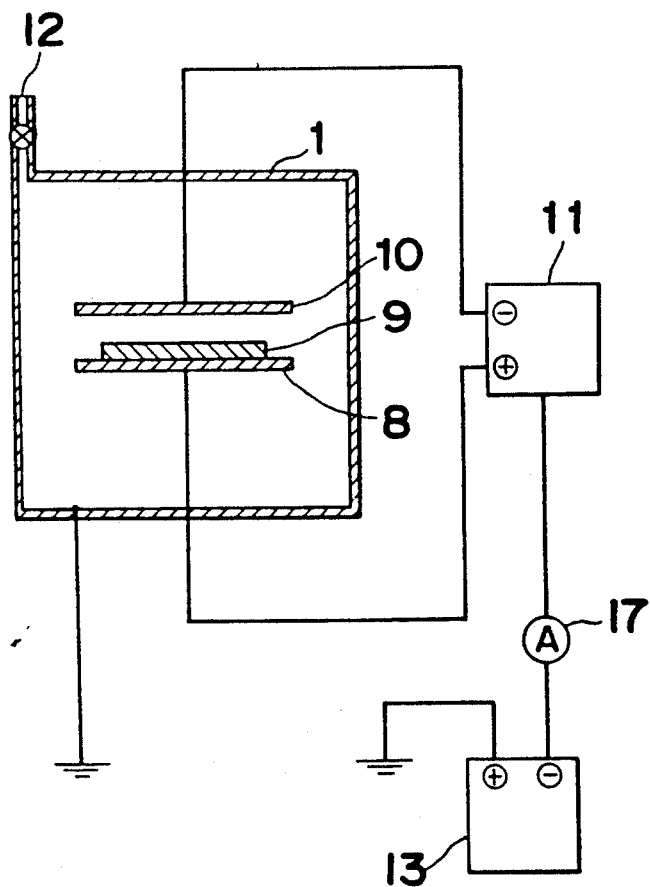
FIG. 6 is a schematic sectional view of the plasma surface treating apparatus according to a second preferred embodiment of the present invention.

FIG. 6 schematically illustrates the plasma surface treating apparatus according to a second preferred embodiment of the present invention. The plasma surface treating apparatus shown therein is similar to that shown in FIG. 4, except that in the apparatus of FIG. 6, an additional source 13 of direct electric current which is not employed in the apparatus of FIG. 4 is employed.

The additional direct current source 13 shown in FIG. 6 is utilized for applying a negative bias to an entire circuit constituted by the electrode 8, the counterelectrode 10 and the direct current source 11. It is, however, to be noted that, while the direct current source 11 has been shown in FIG. 4 as connected to the ground, the direct current source 11 shown in FIG. 6 is not connected to the ground.

The operation of the plasma surface treating apparatus according to the second embodiment of the present invention will now be described as applied to a process of removing the photoresist from the copper substrate as is the case with the foregoing embodiment.

The copper substrate is initially fitted to the electrode 8. Thereafter, as is the case with the foregoing embodiment, the vacuum vessel 1 is evacuated to about $10^{-2}$ Pascal and oxygen is then introduced into the vacuum vessel 1 through the gas inlet port 12. A potential difference of 400 volts is applied between the electrode 8 and the counterelectrode 10 from the direct current source 11 and, at the same time, the negative bias voltage of $-100$ volts is applied from the additional direct current source 13 to the entire circuit including the electrode 8 and the counterelectrode 10. The vacuum vessel 1 is connected to the ground and is held at a potential higher than that of the electrode pair 8 and 10.

Figure 8:
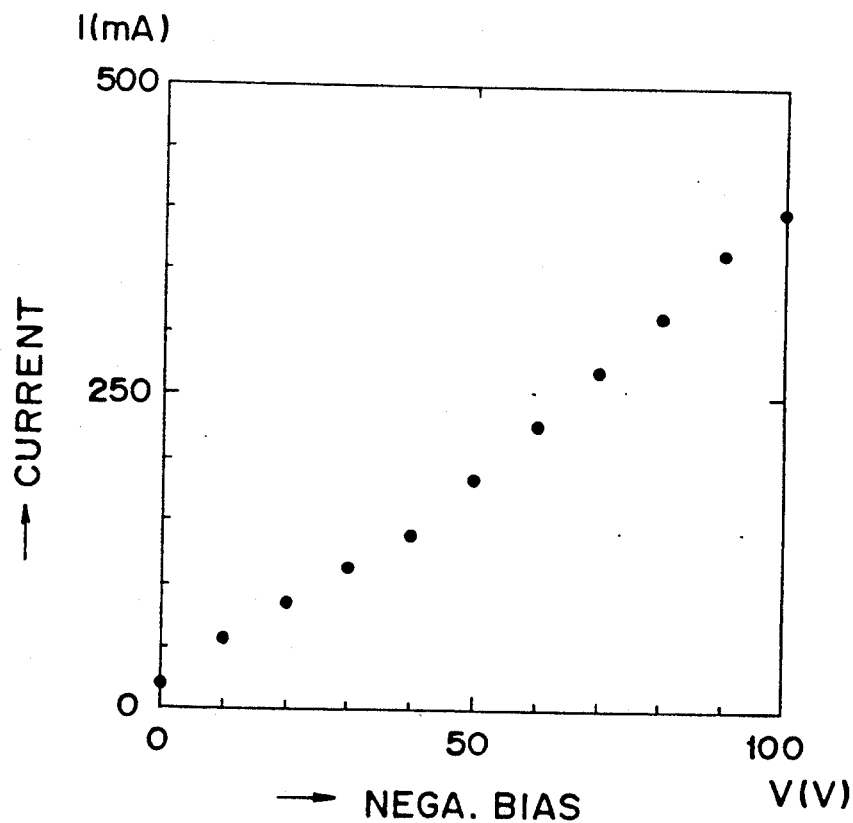
FIG. 8 is a graph showing a relationship between values of a negative bias voltage and values of an electric current flowing through an electric circuit.

The plasma surface treating apparatus according to the second embodiment of the present invention is substantially similar to a Hollow Cathode structure wherein the vacuum vessel 1 is arranged as an anode at respective ends of the electrode pair 8 and 10 and, as is the case with the Hollow Cathode structure, the plasma current density between the electrode 8 and the counterelectrode 10 can be increased as compared with that in the apparatus of FIG. 4, making it possible to increase the processing speed considerably. In fact, a relationship between the negative bias voltage applied from the additional direct current source 13 and the electric current detected by an ammeter 17 is shown in the graph of FIG. 8. In this measurement, the voltages applied from the direct current sources 11 and 13 are respective constant voltages. As shown in this graph, it is clear that, when a negative bias voltage of 10 volts or 100 volts is applied, the electric current of a value about three or twenty times as large as that when no negative bias voltage is applied can be obtained, respectively.

The reason why the second preferred embodiment of the present invention is effective to increase the processing speed is supposed to be that, consequent upon an increase of the plasma current density accompanied by an abrupt increase of the active species, the frequency of impingement of the active species upon the substrate increases rapidly.

Figure 7:
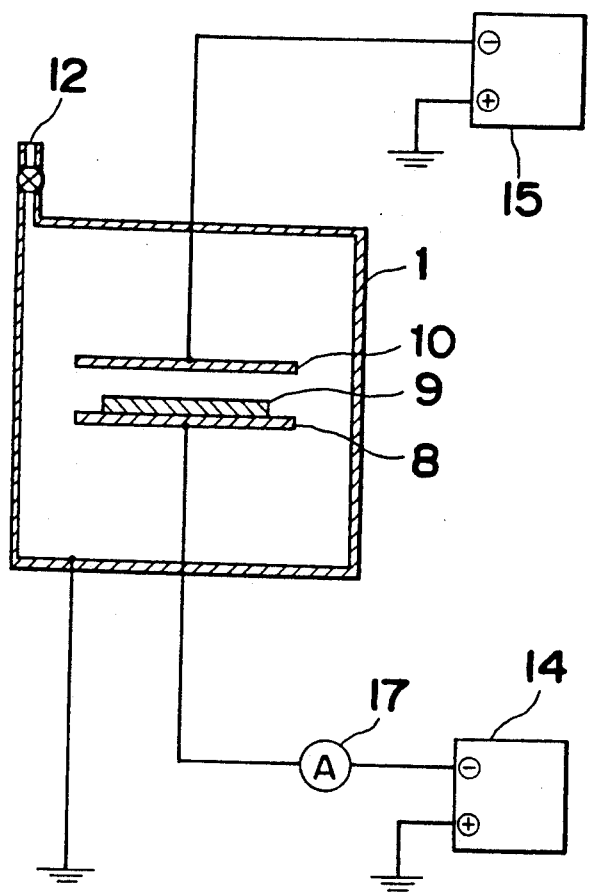
FIG. 7 is a view similar to FIG. 6, showing a modification made to the second embodiment of the present invention.

The plasma surface treating apparatus shown in and described with reference to FIG. 6 may be modified as shown in FIG. 7. In FIG. 7, a first direct current source 14 and a second direct current source 15 are electrically connected with the electrode 8 and the counterelectrode 10, respectively, so that different voltages can be applied thereto independently.

Even the plasma surface treating apparatus shown in FIG. 7 can be operated in a manner similar to that shown in FIG. 6. Specifically, after the electrode pair have been installed, the vacuum vessel 1 is evacuated, followed by an introduction of oxygen into the vacuum vessel 1 through the gas inlet port 12. A voltage of $-100$ volts and a voltage of $-500$ volts are applied from the first and second direct current sources 14 and 15 to the electrode 8 and the counterelectrode 10, respectively. As a result of a potential difference between the electrode 8 and the counterelectrode 10, a glow discharge takes place producing the active species which subsequently impinge upon the substrate to remove the photoresist. Even in the case with the modified apparatus of FIG. 7, relationships in potential at the electrode pair and at the vacuum vessel 1 are similar to those exhibited by the apparatus of FIG. 6 and, therefore, the reaction speed can be increased because of an increased plasma current density.

With the apparatus shown in any one of FIGS. 6 and 7, the plasma density can be increased to a value higher than that exhibited by the apparatus according to the first embodiment of the present invention, thus making it possible to further increase the processing speed at which the surface treatment takes place.

Third Preferred Embodiment

Figure 9:
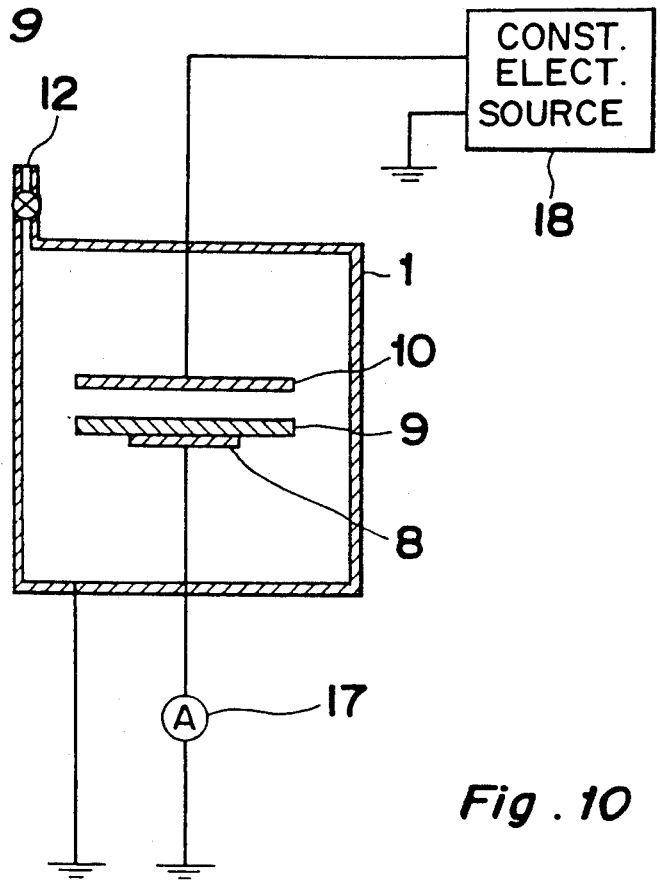
FIG. 9 is a schematic sectional view of the plasma surface treating apparatus according to a third preferred embodiment of the present invention.

Referring now to FIG. 9 showing the plasma surface treating apparatus according to a third preferred embodiment of the present invention, the electrode 8 having the electroconductive substrate 9 fitted thereto is so designed as to be smaller than the substrate 9 and, also, the use has been made of an ammeter 17 for measuring an electric current flowing between the electroconductive substrate 9 and the ground. The use has also been made of a source 18 of constant electric current for applying a voltage to the counterelectrode 10.

The operation of the plasma surface treating apparatus according to the third embodiment of the present invention will now be described as applied to a process of removing the photoresist from the copper substrate 10 with the use of the oxygen plasma as is the case with the first embodiment.

The copper substrate which forms the electroconductive substrate 9 is initially fitted to the electrode 8. It is to be noted that the electrode 8 is of a size which is not exposed bare to the counterelectrode 10 when the electroconductive substrate 9 is mounted thereon, that is, smaller than the size of the counterelectrode 10, so that the electric current flowing towards the electroconductive substrate 9 (or flowing outwardly from the electroconductive substrate) can be accurately monitored by the ammeter 17.

Thereafter, as is the case with the first embodiment, the vacuum vessel 1 is evacuated and oxygen is then introduced into the vacuum vessel 1 through the gas inlet port 12. Thereafter, by applying a voltage from the constant current source 18 to the counterelectrode 10, the plasma treatment is carried out to remove the photoresist from the electroconductive substrate 9.

In this case, since the application of the voltage to the counterelectrode 10 is effected at a constant electric current, a change in electroconductivity of the surface of the electroconductive substrate 9 which forms a sample to be treated, that is, an increase of the electroconductivity consequent upon an exposure of a copper surface resulting from the removal of the photoresist from the copper substrate as in the illustrated embodiment, causes the electric current flowing between the electroconductive substrate and the ground to progressively increase towards a predetermined value. When the electric current so increased is subsequently saturated, it means that the removal of the remaining photoresist has been accomplished completely.

It is to be noted that, although in FIG. 9 the electroconductive substrate 9 has been shown as connected to the ground through the ammeter 17, the electroconductive substrate 9 may be designed to receive a potential from a direct current source as is the case with the apparatus shown in and described with reference to FIG. 7. In such a case, however, in order to enable the ammeter 17 to monitor the progress of the plasma surface treatment, the application of a voltage to the electrode 8 should be effected at a constant voltage.

According to the third preferred embodiment of the present invention, the monitoring of the electric current with the ammeter can advantageously provide an indication of the progress of the reaction taking place and, therefore, it is possible to detect the termination of the reaction by monitoring the completion of an increase of the electric current measured by the ammeter. This method is particularly advantageous for the removal of the remaining photoresist from the electroconductive substrate.

Also, the detection of the progress of the reaction such as accomplished with the apparatus according to the third embodiment of the present invention makes it possible to control all of the samples so as to have substantially equal surface conditions.

In the foregoing description associated with the third embodiment of the present invention, it has been described that the termination of the reaction of the plasma surface treatment can be indicated by the increase in electric current, that is, when the ammeter indicates that the electric current has been saturated. However, in the case where an oxide is to be formed on a surface of a sample with the oxygen plasma, the termination of the reaction can be indicated by a decrease in electric current measured by the ammeter 17 because the electroconductivity of the sample surface decreases with progress of the reaction.

In the practice of the third embodiment of the present invention, although the glow discharge is preferred to take place in the abnormal glow discharge region in order to increase the plasma processing speed, it is clear that determination of the termination of the reaction by the ammeter 17 is not affected by whether the glow discharge is effected in the normal glow discharge region or whether it is effected in the abnormal glow discharge region.

Fourth Preferred Embodiment

Figure 10:
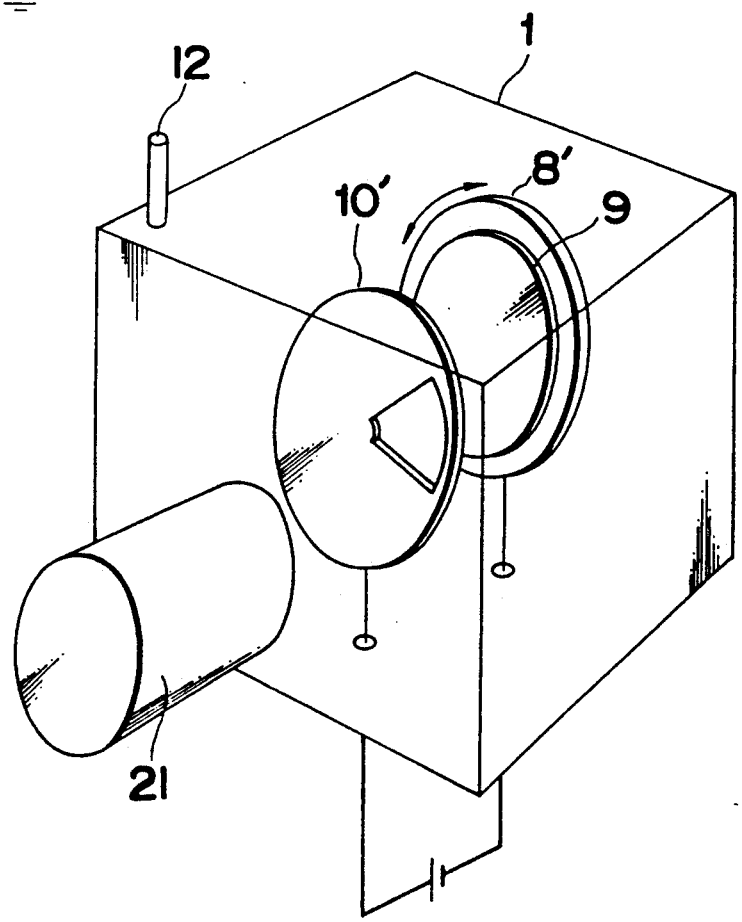
FIG. 10 is a schematic perspective view of the plasma surface treating apparatus according to a fourth preferred embodiment of the present invention.

The plasma surface treating apparatus according to a fourth preferred embodiment of the present invention is schematically shown in FIG. 10. In describing the apparatus shown in FIG. 10, reference will be made to the removal of the photoresist from a disc-shaped copper substrate of 30 cm in diameter. In this embodiment, a photoresist of about 100 nm in thickness was initially coated on the copper substrate, to which a pattern recording and a developing treatment were then carried out with the use of light of a short wavelength. The photoresist remaining on the copper substrate at the time a pattern was formed on the copper substrate through the dry etching by an ion supply device was removed from the copper substrate with the use of the oxygen plasma.

Referring to FIG. 10, reference numeral 8' represents a rotary electrode for supporting the electroconductive substrate 9 for rotation together therewith, and reference numeral 10' represents a counterelectrode confronting the rotary electrode 8'. The counterelectrode 10' has a generally sector-shaped opening defined therein and an ion supply device 21 is disposed in alignment with the sector-shaped opening in the counterelectrode 10'. As will become clear from the subsequent description, the counterelectrode 10' serves concurrently as a shielding mask used during a dry-etching process.

Also, in the fourth embodiment of the present invention, the distance between a surface of the copper substrate 9 fitted to the rotary electrode 8' and the shielding mask, i.e., the counterelectrode 10', is chosen to be about 1 cm while the electrodes 8' and 10' are accommodated within the vacuum vessel 1.

In order to perform the plasma surface treatment, argon (Ar) gas is initially introduced into the ion supply device 21 for ionization to produce a plasma. Ar ions are then extracted from the plasma generated in the ion supply device 21 and are subsequently radiated to the copper substrate 9 through the sector-shaped opening in the counterelectrode 10', thereby to form a pattern on the copper substrate. This process is called the "dry-etching process".

Thus, the counterelectrode 10' serves concurrently as the ion shielding mask by which a slantwise component of the radiated ions can be shielded thereby to provide a uniform profile of beams. It is to be noted that, during this dry-etching process, the copper substrate 9 is rotated together with the rotary electrode 8' about the center of the copper substrate 9 so that the radiations can fall uniformly on the copper substrate 9.

While the pattern can be formed on the copper substrate 9 in the above described manner, the formation of the pattern on the copper substrate is followed by the removal of a photoresist which was left unremoved from the surface of the copper substrate 9 without being completely etched off. This remaining photoresist is removed in a manner which will now be described.

Subsequent to the etching, the supply of the Ar gas is interrupted, followed by an evacuation of the vacuum vessel 1 to about $10^{-2}$ Pascal which is then followed by an introduction of oxygen into the vacuum vessel 1 through the gas inlet port 12 so that the pressure inside the vacuum vessel 1 can attain about 10 Pascal.

Thereafter, a voltage is applied across the electrodes 8' and 10' to induce a direct current glow discharge to produce an oxygen plasma containing active species. The active species in the oxygen plasma are then caused to react with the remaining photoresist on the copper substrate for the removal of the photoresist.

It is to be noted that, if the counterelectrode 10' is of a hollow structure having a chamber capable of accommodating cooling water, any undesirable increase in temperature during the etching process and the surface treatment can be minimized. This makes it possible to avoid any possible reduction in a ratio of selection between the copper substrate and the photoresist during the dry etching process and also to minimize any possible occurrence of an arc discharge during the surface treatment.

Also, instead of the counterelectrode 10' used in its entirety as a counterelectrode, that surface of the counterelectrode 10' which confronts the sample to be treated may be fitted with a metallic plate of a shape similar to the counterelectrode 10' while an electrically insulating sheet such as, for example, tetrafluoroethylene sheet is interposed between the counterelectrode 10' and the metallic plate. If this type of counterelectrode is employed and the metallic plate is used as an actual counterelectrode, the counterelectrode 10' in its entirety need not be insulated from the ground. This is particularly advantageous for use with the counterelectrode of hollow structure, and this embodiment of the present invention can easily be realized if this type of counterelectrode is employed.

Even the fourth embodiment of the present invention is effective to monitor the progress of the plasma surface treatment if an ammeter is provided in a manner similar to the third embodiment of the present invention. Also, the plasma processing speed can be increased by generating the glow discharge in the abnormal glow discharge region as is the case with the first embodiment of the present invention. Moreover, the plasma surface treatment with the apparatus of FIG. 10 can be accomplished in a manner similar to that accomplished by the apparatus according to the second embodiment of the present invention.

Furthermore, according to the fourth embodiment of the present invention, the plasma surface treatment of the sample can be advantageously continued from the dry etching process without the necessity of removing the vacuum from the vacuum vessel 1. Therefore, the copper substrate to be treated need not be moved from equipment to equipment when the etching process is followed by the removal of the remaining photoresist, and any possible contamination of the sample which would occur when the sample is removed out from one equipment for the transfer to the other equipment can be eliminated, thereby minimizing the occurrence of defective patterns on the samples. This is particularly effective in in-line processing the pattern forming process.

Although the present invention has been fully described in connection with the preferred embodiments thereof with reference to the accompanying drawings, it is to be noted that various changes and modifications are apparent to those skilled in the art. For example, the voltage to be applied and/or the distance between the discharge electrodes may be chosen in consideration of the reactivity of the sample to be treated, the plasma current density that is realized and/or the length of time during which the treatment is carried out.

Accordingly, such changes and modifications are to be understood as included within the scope of the present invention, as defined by the appended claims, unless they depart therefrom.

What is claimed is:

1. A plasma surface treating method comprising the steps of:
   providing a vacuum vessel electrically connected to the ground;
   supporting a sample to be treated on a first electrode within said vacuum vessel;
   confronting said first electrode with a second electrode;
   generating active species of negative ions by applying a voltage across said electrodes for producing a direct current glow discharge in an abnormal glow discharge region; and
   applying a bias voltage, which is negative relative to said grounded vacuum vessel, to said first and second electrodes.

2. The method according to claim 1, wherein the step of applying a voltage comprises connecting a constant voltage source across said first and second electrodes and said method further comprises connecting an ammeter between said first electrode and said constant voltage source, and detecting the progress and termination of the generating step by detecting a variation in electric current detected by said ammeter.

3. A plasma surface treating method comprising the steps of:
   providing a vacuum vessel;
   supporting a sample to be treated on a first electrode within said vacuum vessel, said first electrode being smaller in size than said sample; and electrically connecting said first electrode to ground;
   confronting said first electrode with a second electrode;
   generating active species of negative ions by applying a voltage across said electrodes for producing a direct current glow discharge in an abnormal glow discharge region;
   connecting an ammeter in the electrical connection of said first electrode to ground; and
   detecting the progress and termination of the generating step by detecting a variation in electric current detected by said ammeter.

* * * * *